United States Patent
Srikanth et al.

(10) Patent No.: US 12,347,246 B2
(45) Date of Patent: Jul. 1, 2025

(54) VEHICLE COMPONENT HEALTH DETECTION

(71) Applicant: Robert Bosch GmbH, Stuttgart (DE)

(72) Inventors: Jatavalaba Vijay Kumar Srikanth, Canton, MI (US); Abhijith Cheradiyaniyil Sabu, Bangalore (IN)

(73) Assignee: Robert Bosch GmbH, Stuttgart (DE)

( * ) Notice: Subject to any disclaimer, the term of this patent is extended or adjusted under 35 U.S.C. 154(b) by 188 days.

(21) Appl. No.: 18/058,182

(22) Filed: Nov. 22, 2022

(65) Prior Publication Data
US 2024/0169767 A1  May 23, 2024

(51) Int. Cl.
| | | |
|---|---|---|
| G07C 5/00 | (2006.01) | |
| G01R 31/367 | (2019.01) | |
| G01R 31/3835 | (2019.01) | |
| G01R 31/392 | (2019.01) | |
| G07C 5/02 | (2006.01) | |
| B62J 50/21 | (2020.01) | |

(52) U.S. Cl.
CPC .......... *G07C 5/008* (2013.01); *G01R 31/367* (2019.01); *G01R 31/3835* (2019.01); *G01R 31/392* (2019.01); *G07C 5/02* (2013.01); *B62J 50/21* (2020.02)

(58) Field of Classification Search
None
See application file for complete search history.

(56) References Cited

U.S. PATENT DOCUMENTS

| 7,082,359 B2 | 7/2006 | Breed |
|---|---|---|
| 11,182,987 B2 | 11/2021 | Davidson |
| (Continued) | | |

FOREIGN PATENT DOCUMENTS

| FR | 2975188 A1 | 11/2012 |
|---|---|---|
| GB | 2537612 A | 10/2016 |
| (Continued) | | |

OTHER PUBLICATIONS

Pascoe et al. "The behavior of the coup de fouet of valve-regulated lead-acid batteries." Journal of Power Sources, vol. 111, Issue 2, 2002, pp. 304-319, ISSN 0378-7753 (Year: 2002).*

(Continued)

*Primary Examiner* — Peter D Nolan
*Assistant Examiner* — Jacob Kent Besteman-Street
(74) *Attorney, Agent, or Firm* — Michael Best & Friedrich LLP (57) ABSTRACT

A system of diagnosing vehicle component health. One example includes a component of a vehicle installed within a vehicle, and a sensor coupled to the component of the vehicle. The sensor is configured to obtain operational data and output a signal including the operational data. The system also includes a communication device configured to receive the signal and wirelessly transmit the operational data to an electronic processor located on a server external to the vehicle. The electronic processor is configured to analyze the operational data via a machine learning algorithm, generate a state-of-health of the component, and in response to the generated state-of-health, transmit, from the electronic processor to an external device, the state-of-health of the component.

15 Claims, 6 Drawing Sheets
(1 of 6 Drawing Sheet(s) Filed in Color)

(56) References Cited

U.S. PATENT DOCUMENTS

| | | | |
|---|---|---|---|
| 11,328,541 B2 | 5/2022 | Aiello et al. | |
| 11,333,712 B2 | 5/2022 | Sudarsan | |
| 2010/0060236 A1* | 3/2010 | Delaille | H02J 7/0047 |
| | | | 320/134 |
| 2011/0060538 A1* | 3/2011 | Fahimi | G01R 31/392 |
| | | | 702/63 |
| 2014/0107885 A1* | 4/2014 | Hagen | G07C 5/006 |
| | | | 701/33.4 |
| 2016/0035150 A1* | 2/2016 | Barfield, Jr. | G05B 23/0254 |
| | | | 701/29.3 |
| 2017/0116793 A1* | 4/2017 | Lin | G07C 5/085 |
| 2018/0202398 A1 | 7/2018 | Jammoussi et al. | |
| 2018/0229744 A1* | 8/2018 | Manzari | F01M 11/10 |
| 2019/0241092 A1* | 8/2019 | Kyes | G07C 5/085 |
| 2019/0384257 A1* | 12/2019 | Zhang | G06F 11/008 |
| 2020/0346155 A1* | 11/2020 | Krishnamurthy | G01N 21/95 |
| 2020/0363296 A1* | 11/2020 | Westlund | G06N 7/01 |
| 2020/0412146 A1* | 12/2020 | Takechi | H02J 7/005 |
| 2022/0067667 A1* | 3/2022 | Mahipal | G07C 5/006 |
| 2022/0068053 A1* | 3/2022 | Hinduja | B60W 50/0205 |
| 2022/0118991 A1* | 4/2022 | Chen | B60W 50/038 |
| 2022/0153166 A1 | 5/2022 | Rangel et al. | |
| 2022/0198842 A1 | 6/2022 | Agarwal et al. | |
| 2022/0270415 A1 | 8/2022 | Palai et al. | |
| 2023/0063601 A1* | 3/2023 | Upadhyay | G07C 5/006 |
| 2023/0377384 A1* | 11/2023 | John Britto | G01L 13/00 |

FOREIGN PATENT DOCUMENTS

| | | |
|---|---|---|
| KR | 20070074621 A | 7/2007 |
| KR | 20190108754 A | 9/2019 |
| WO | 2022023958 A1 | 2/2022 |

OTHER PUBLICATIONS

International Search Report for Application No. PCT/EP2023/082246 dated Feb. 27, 2024 (5 pages).

Gong et al., "Data-driven lithium-ion battery remaining life prediction on actual operating vehicles," 6th International Conference on Transportation Information and Safety (ICTIS), 2021, pp. 1118-1128.

Mawonou et al., "State-of-health estimators coupled to a random forest approach for lithium-ion battery aging factor ranking," Journal of Power Sources, 2021, vol. 484, 14 pages.

* cited by examiner

VEHICLE COMPONENT HEALTH DETECTION

FIELD

Aspects, features, and embodiments described herein relate to systems for vehicle component health detection.

SUMMARY

Many vehicles include components designed to be replaced after use or time, such as air filters or batteries. Additionally, many vehicles include tools for monitoring the overall health of those components. Some vehicles include onboard computer systems designed to diagnose component health and provide an indication that replacement or repair is necessary. It may be desirable to improve the accuracy of such diagnostics. Therefore, embodiments described herein provide, among other things, systems and methods for detecting vehicle component health.

Some examples provide a system of diagnosing vehicle component health. In one instance, a system includes a component of a vehicle, for examples, installed within the vehicle, and a sensor coupled to the component of a vehicle. The sensor is configured to obtain operational data and output a signal including the operational data. The system also includes a communication device configured to receive the signal and wirelessly transmit the operational data to an electronic processor located on a server external to the vehicle. The electronic processor is configured to analyze the operational data via machine learning algorithm, such as a linear regression algorithm, generate a state-of-health of the component, and in response to the generated state-of-health, transmit, from the electronic processor to an external device, the state-of-health of the component.

Another example provides a method of diagnosing a vehicle component. In one instance, the method includes obtaining operational data, via an electronic processor, corresponding to an operational parameter of a vehicle component and determining, via the electronic processor, a plurality of machine learning model features, such as classification model features using the operational data. The method also includes collating, via the electronic processor, the plurality of classification model features into a plurality of sequenced rows, and inputting, into a machine learning model, the plurality of sequenced rows The method also includes determining, via the linear regression model, a classification score for each of the plurality of sequenced rows and determining an average classification score for the plurality of sequenced rows. The method also includes determining a state-of-health for the vehicle component based upon the average classification score, and in response to determining the state-of-health for the vehicle component, transmitting, to an external device, the state-of-health for the vehicle component. In some examples, alternative methods to a linear regression model may be used in determining the classification score.

Other examples provide a method of diagnosing motorcycle battery health that includes obtaining operational data, via an electronic processor, corresponding to operational parameters of a motorcycle battery, and determining, via the electronic processor, a plurality of classification model features using the operational data. The method also includes collating, via the electronic processor, the plurality of classification model features into a plurality of sequenced rows, and inputting, into an algorithm, the plurality of sequenced rows. The method also includes determining, via the algorithm, a classification score for each of the plurality of sequenced rows and computing, via the electronic processor, an average classification score for the plurality of sequenced rows The method also includes determining, via the electronic processor, a state-of-health for the vehicle component based upon the average classification score, and in response to determining the state-of-health for motorcycle battery, transmitting, to an external device, the state-of-health for the motorcycle battery.

Other aspects, features, and embodiments will become apparent by consideration of the detailed description and accompanying drawings.

DETAILED DESCRIPTION

The patent or application file contains at least one drawing executed in color. Copies of this patent or patent application publication with color drawing(s) will be provided by the Office upon request and payment of the necessary fee.

Figure 1:
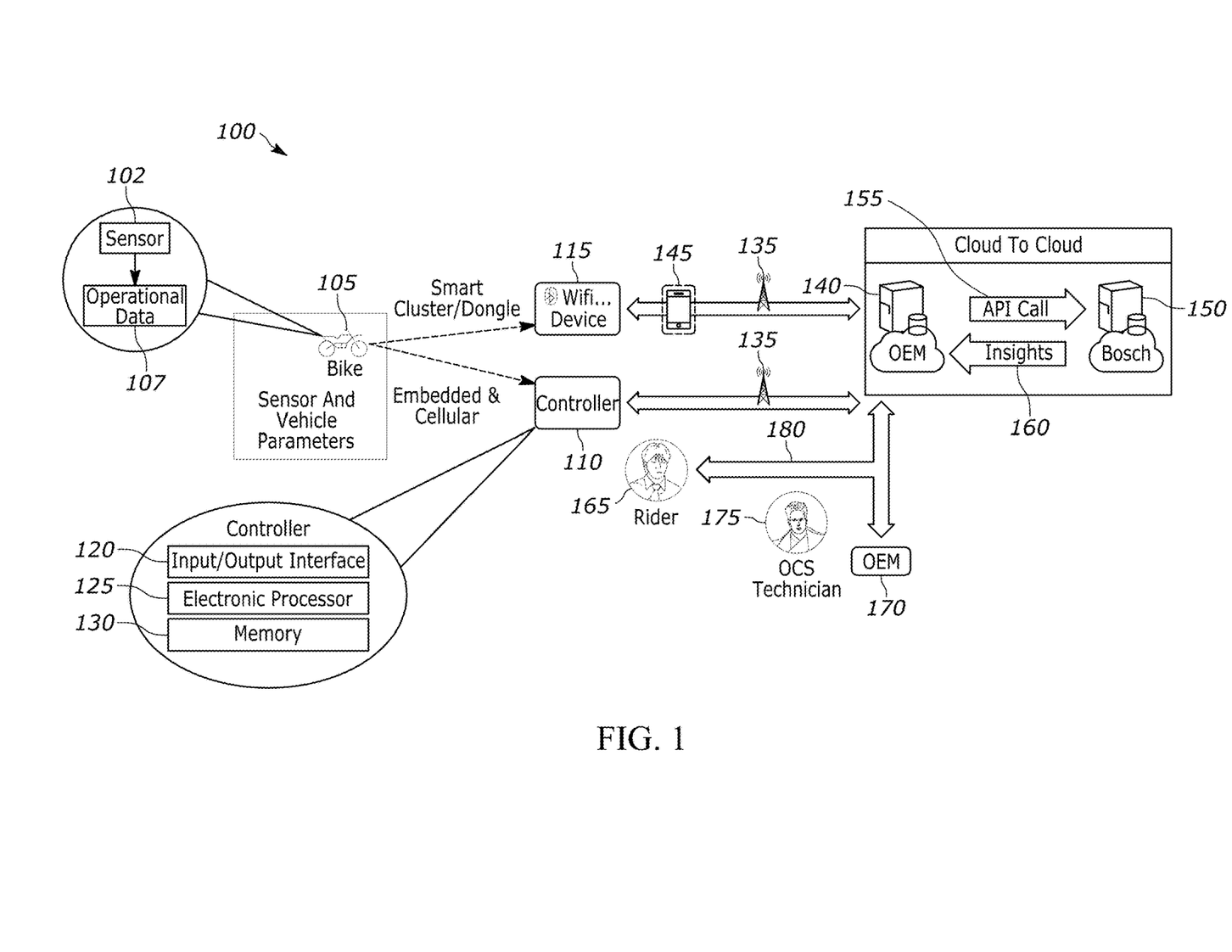
FIG. 1 is an illustration of a system of vehicle component health detection, according to some aspects.

FIG. 1 is an illustration of a system of vehicle component health detection according to some examples and aspects. The system 100 includes a vehicle 105, such as a motorcycle (or bike). The vehicle 105 includes replaceable or serviceable components, such as an air filter, a battery, tires, one or more brake pads, chains, belts, and the like. The vehicle 105 also includes one or more sensors configured to monitor the vehicle components and produce vehicle operating parameters. For instance, the vehicle 105 includes a sensor 102 configured to detect air flow through the air filter and produce a signal. The operational data 107 corresponding to the operational parameters of the air filter may be derived from the signal. In one example, the operational parameters of the air filter include an amount of air flowing through the air filter, or a percentage of the total air filter that is clogged by captured debris. Other vehicle components may include additional sensors, such as a sensor for detecting voltage of a battery, or a sensor for detecting wear of a brake pad, a sensor for detecting tire air pressure, or the like. In the description that follows, operational data 107 refers to operational data derived from the information or signals provided by one or more of the sensors (for example, the sensor described above) or timing devices of the vehicle. Thus, operational data 107 may include information related to general vehicle operations, such as the time of day the vehicle 105 runs, how long the vehicle 105 runs for, a vehicle 105 load, vehicle speed (for example, a speed log), engine revolutions per minute (RPM), engine speed, throttle position (or a throttle log), and the like.

The operational data 107 is sent or otherwise provided to an embedded controller, such as a controller 110 in the vehicle 105. In one example, the controller 110 includes an input/output interface 120, an electronic processor 125, and memory 130. In some examples, electronic processor 125 is implemented as a microprocessor with separate memory, for example the memory 130. In other examples, the electronic processor 125 may be implemented as a microcontroller (with memory 130 on the same chip). In other examples, the electronic processor 125 may be implemented using multiple processors. In addition, the electronic processor 125 may be implemented partially or entirely as, for example, a field-programmable gate array (FPGA), an applications specific integrated circuit (ASIC), and the like and the memory 130 may not be needed or be modified accordingly. In some examples, the memory 130 includes non-transitory, computer-readable memory that stores instructions that are received and executed by the electronic processor 125 to carry out methods described herein. The memory 130 may include, for example, a program storage area and a data storage area. The program storage area and the data storage area may include combinations of different types of memory, for example read-only memory and random-access memory. The input/output Interface 120 may include one or more input mechanisms and one or more output mechanisms (for example, general-purpose input/outputs (GPIOs), a controller area network bus (CAN) bus interface, analog inputs, digital inputs, and others). The controller 110 is configured to wirelessly communicate, over a wireless link or connection 135, with a cloud-based server such as first server 140. The wireless connection 135 may be a radio access network connection, a cellular connection, a satellite connection, or the like. In some examples, first server 140 is owned or operated by an original equipment manufacturer (OEM). The OEM may provide services based upon the operational data 107, such as component repair, replacement, or other services.

In another example, the operational data 107 is communicated to an external device, such as a dongle 115, configured to communicate with the vehicle 105. The dongle 115 includes an internal input/output interface, electronic processor, and memory similar to the components described in the controller 110. The dongle 115 is configured to communicate with an external device 145, such as a smart phone, tablet, laptop, or the like. The dongle 115 preferably communicates with the external device 145 wirelessly via a near field communication (NFC) connection, a short-range wireless connection (for example, a Bluetooth® connection), an IEEE 802.11 protocol connection (for example, Wi-Fi), or the like. In other examples, the dongle 115 communicates with the external device 145 via a wired connection. The external device 145 is configured to wirelessly communicate with a cloud-based server. For example, the external device 145 wirelessly communicates via the wireless connection 135 to the first server 140, functionally similar to the wireless communication of the controller 110 with the first server 140.

The first server 140 is configured to receive from the controller 110 or the external device 145, the operational data 107. The first server 140 is also configured to communicate with other cloud-based servers, such as second server 150. In some examples, first server 140 acts as an intermediary communication service for collecting the operational data 107 from the vehicle 105 before sending the operational data 107 to the second server 150. In other examples, the first server 140 processes, compresses, collates, or categorizes the operational data 107 before sending the operational data 107 to the second server 150. In some examples, the transfer of data is facilitated by an application programming interface (API) 155. For example, the first server 140 may send the operational data 107 to the second server 150 via the application programming interface (API) 155. For instance, in some examples, the second server 150 generates a call requesting the operational data 107 from the first server 140. In other examples, the operational data 107 is batched by the first server 140 before being pushed to the second server 150. The second server 150 processes the operational data 107 using an algorithm to determine a state-of-health of a vehicle component associated with the operational data. The algorithm, and process for determining the state-of-health of the vehicle component, are described later with respect to FIGS. 2-6.

In one example, after the second server 150 has generated a state-of-health of the vehicle component, the second server 150 transmits an insight 160 to the first server 140. The insight 160 includes actionable advice based upon the state-of-health of the component. For example, the insight 160 may provide actionable advice including the replacement of the air filter that the second server 150 determined was in a poor state-of-health. In another example, the insight 160 includes actionable advice including the repair of the air filter that the second server 150 determined was in a moderate state-of-health. Alternatively, the insight 160 may include information that the air filter does not need repair or replacement and is in a good state-of-health. The second server 150 is configured to output these insights 160 to any combination of the vehicle operator, such as rider 165, the OEM 170, or a service technician 175, via an interface 180. The interface 180 may be a wireless or wired interface. In some examples, aspects of the algorithm, first server 140, or second server 150 may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links.

Figure 2:
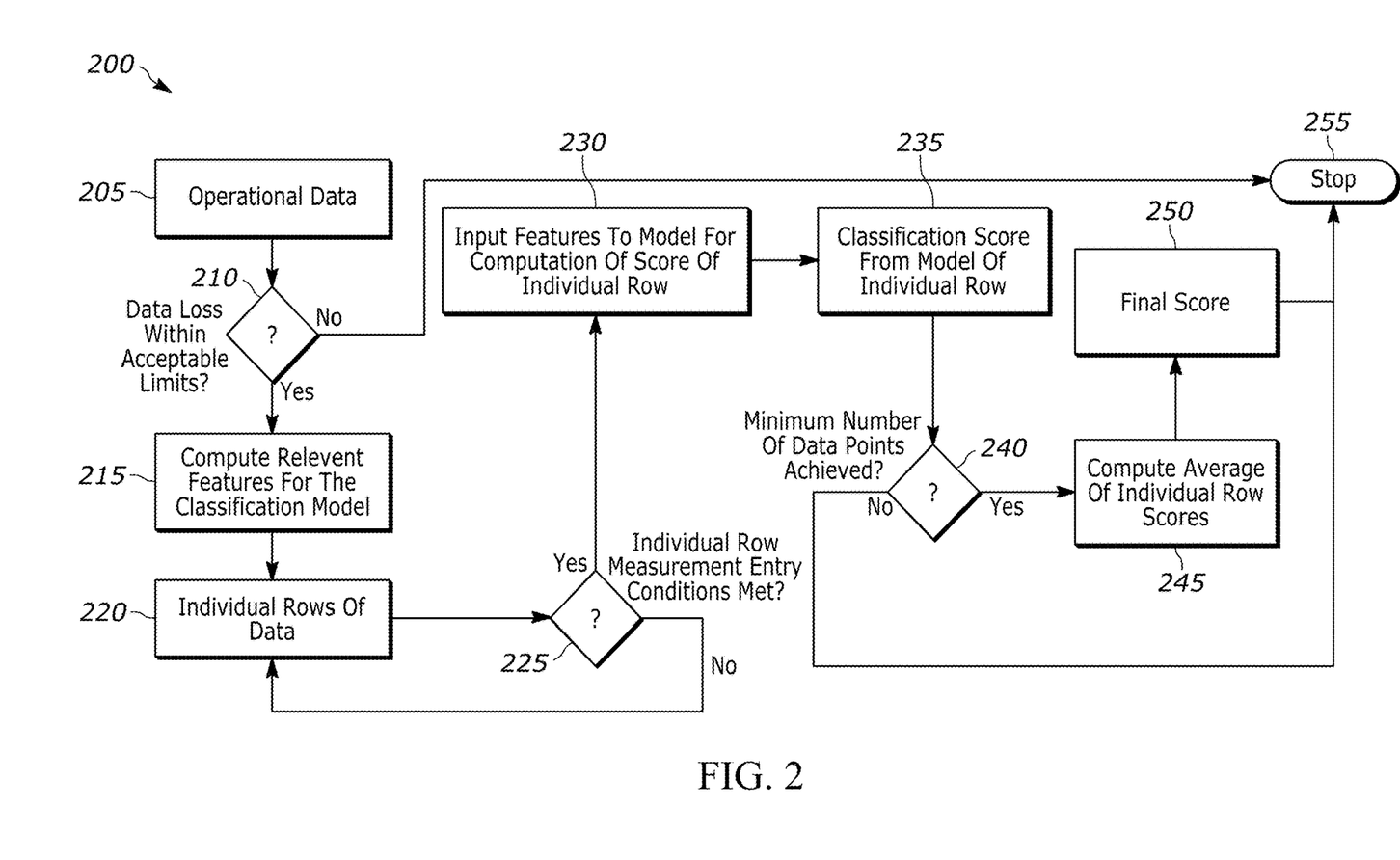
FIG. 2 is a flowchart of a process of vehicle component health detection, according to some aspects.

FIG. 2 is an illustration of an example process 200 of vehicle component health detection, according to some aspects. In some instances, the process 200 is executed on the second server 150. In such an example, the second server 150 obtains the operational data 107 (STEP 205). The second server 150 then determines (STEP 210) whether data loss of the operational data is within an acceptable limit. If the data loss is not within an acceptable limit, the process stops (STEP 255). If the data loss is within an acceptable limit the second server 150 determines relevant features for the classification model using a machine learning algorithm (STEP 215). In this example, the classification model is a linear regression algorithm. In some examples, the relevant features for the classification model are also referred to as a plurality of classification model features. The relevant features for the classification model include weights assigned to individual datum within the operational data 107. In some examples, depending on the particular vehicle component, different weights are assigned to different data. For instance, when computing the state-of-health of the air filter, a particular weight value is assigned to data associated with intake air temperature, a throttle percentage, an air flow speed, an air pressure, or the like. In another instance, when computing the state-of-health of the vehicle battery, different weight values are assigned to the data. In some instances, weights for the operational data depend on the specific vehicle and its operating conditions, and the influence of each of the factors vary between vehicles. In some instances, the classification model uses alternative or additional regression models.

The process 200 includes collating the operational data 107 into a plurality of sequenced rows. The plurality of sequenced rows includes individual rows of data, which are collated by the second server 150 (STEP 220). Once the operational data is collated into individual rows, the second server 150 determines if the individual row measurement entry conditions are met (STEP 225). In some examples, entry conditions include predetermined thresholds, such as an engine throttle percentage or an engine speed. The second server 150 determines whether the individual row measurement entry conditions have not been met. If so, the second server 150 continue to collate data (and process returns to STEP 220). If the second server 150 determines that the individual row measurement entry conditions have been met, the process 200 proceeds (STEP 230), where the relevant features are input into the classification model for computation of a score for the individual rows. The classification model then produces a classification score for each of the individual rows(STEP 235). The second server 150 then determines if a minimum number of data points has been achieved (STEP 240). The minimum number of data points are required to compute a final state-of-health score. If the second server 150 determines that a minimum number of data points has not been achieved, the process 200 stops (STEP 255). If the second server 150 determines that a minimum number of data points has been achieved, then the classification model computes an average of individual row scores, also referred to as an average classification score for the plurality of sequenced rows (STEP 245). The classification model then computes a final state-of-health score (STEP 250), before stopping at STEP 255. In some examples, the final state-of-health is further output to another device, such as an external device. For example, in some instances, the final state-of-health for the vehicle component is sent to the rider 165, the OEM 170, the service technician 175, or the like. In this example, the process 200 is performed by the second server 150. However, in other examples, the process 200 is performed by other servers, such as first server 140.

Figure 3:
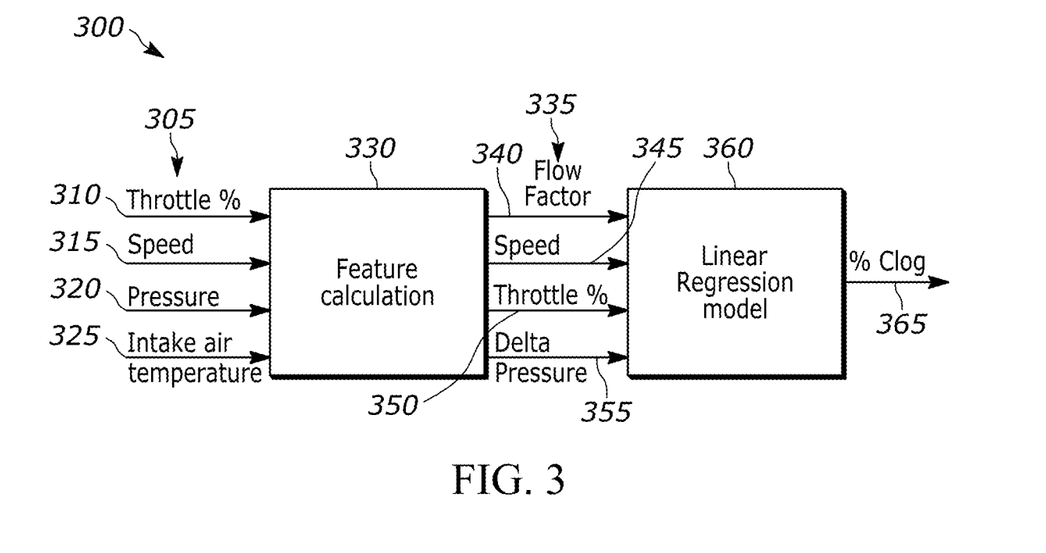
FIG. 3 is an illustration of data flow into a feature calculation and through a regression model, according to some aspects.

FIG. 3 is an illustration of data flow into a feature calculation and through a regression model, also referred to as process 300, according to some aspects. In some examples, the regression model is performed by the electronic processor of the second server 150. The process 300 applies to the air filter of the vehicle 105 and is similar process 200. The process 300 includes STEP 305 where the second server 150 obtains operational data 107 including entry conditions, such as a vehicle engine throttle percentage 310, an engine speed 315 (also known as an engine revolutions per minute), an engine manifold pressure level 320, and an intake air temperature 325. The second server 150 then uses the operational data 107 in STEP 330 to assign mathematical weights to the operational data during the feature calculation. The process 300 includes STEP 335, where the second server 150 uses the weights generated during STEP 330 to generate weighted data, including a weighted flow factor 340, a weighted engine speed 345, a weighted engine throttle percentage 350, and a delta pressure value 355. At STEP 360, the weighted data is then used by the classification model, or linear regression model, to calculate a state-of-health of the air filter. For example, a state-of-health for the air filter includes a clog percentage of the air filter. This clog percentage is then output by the linear regression model in STEP 365. In some instances, other vehicle components are analyzed using a similar process using the same, or other, operational data.

Figure 4:
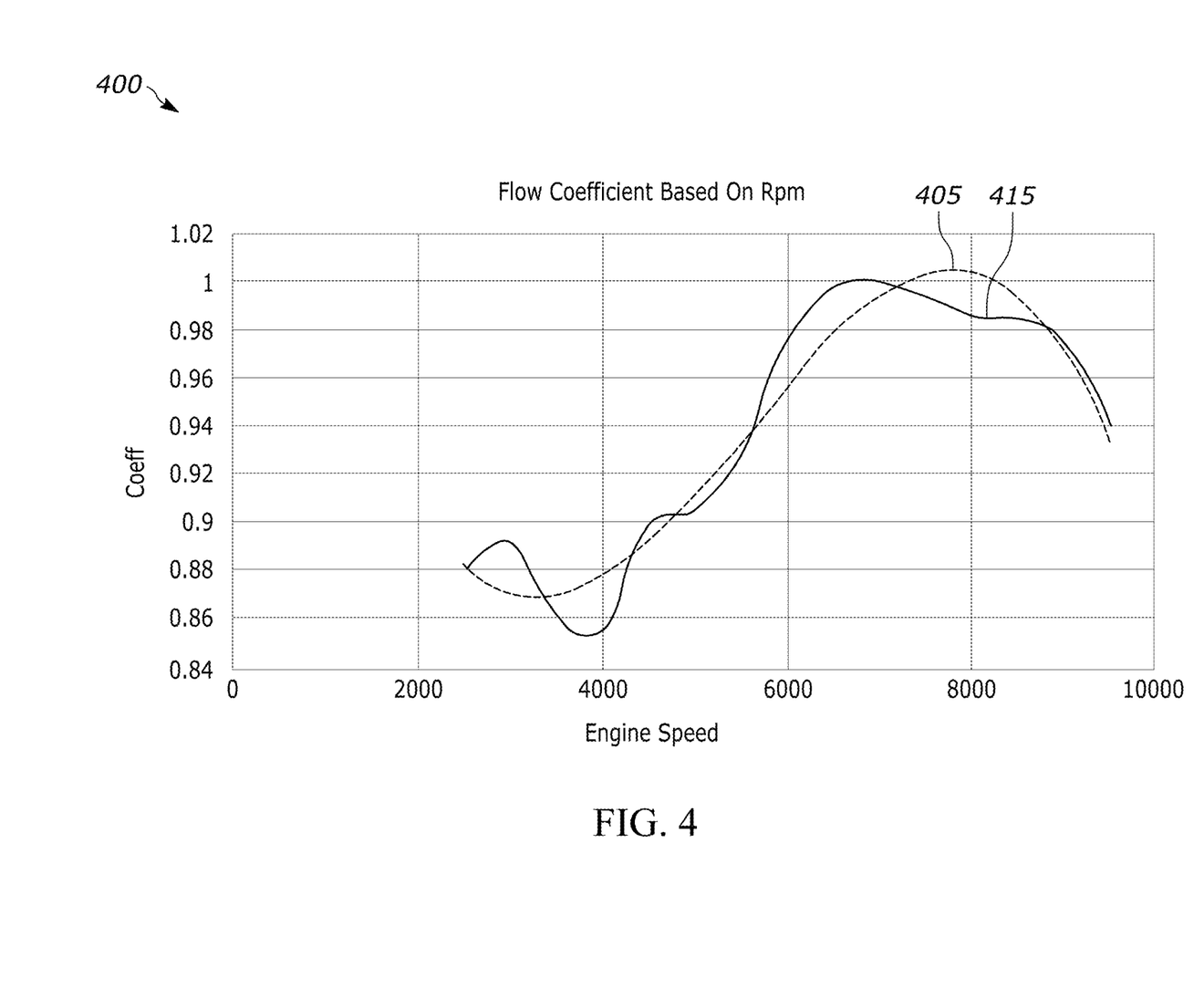
FIG. 4 is a graph of a vehicle air filter flow coefficient, according to some aspects.

FIG. 4 is a graph 400 of a vehicle air filter flow coefficient, according to some aspects. In some examples, the graph 400 corresponds with the process 300 as previously described. The graph 400 includes a flow coefficient trace 405. In this example, the flow coefficient trace 405 is generated by the classification model of process 200 or process 300 as previously described. In some instances, the air flow classification model is a linear regression model. The linear regression model uses a quadratic equation that includes coefficient weights for various vehicle components, as previously described. For instance, in some examples, each coefficient for the variable of the quadratic equation is associated with a different weight. As previously described, the weights vary with various components and vary from vehicle to vehicle. Furthermore, in some examples, the quadratic equation includes a constant that also varies based on variations in components and vehicles.

Figure 5:
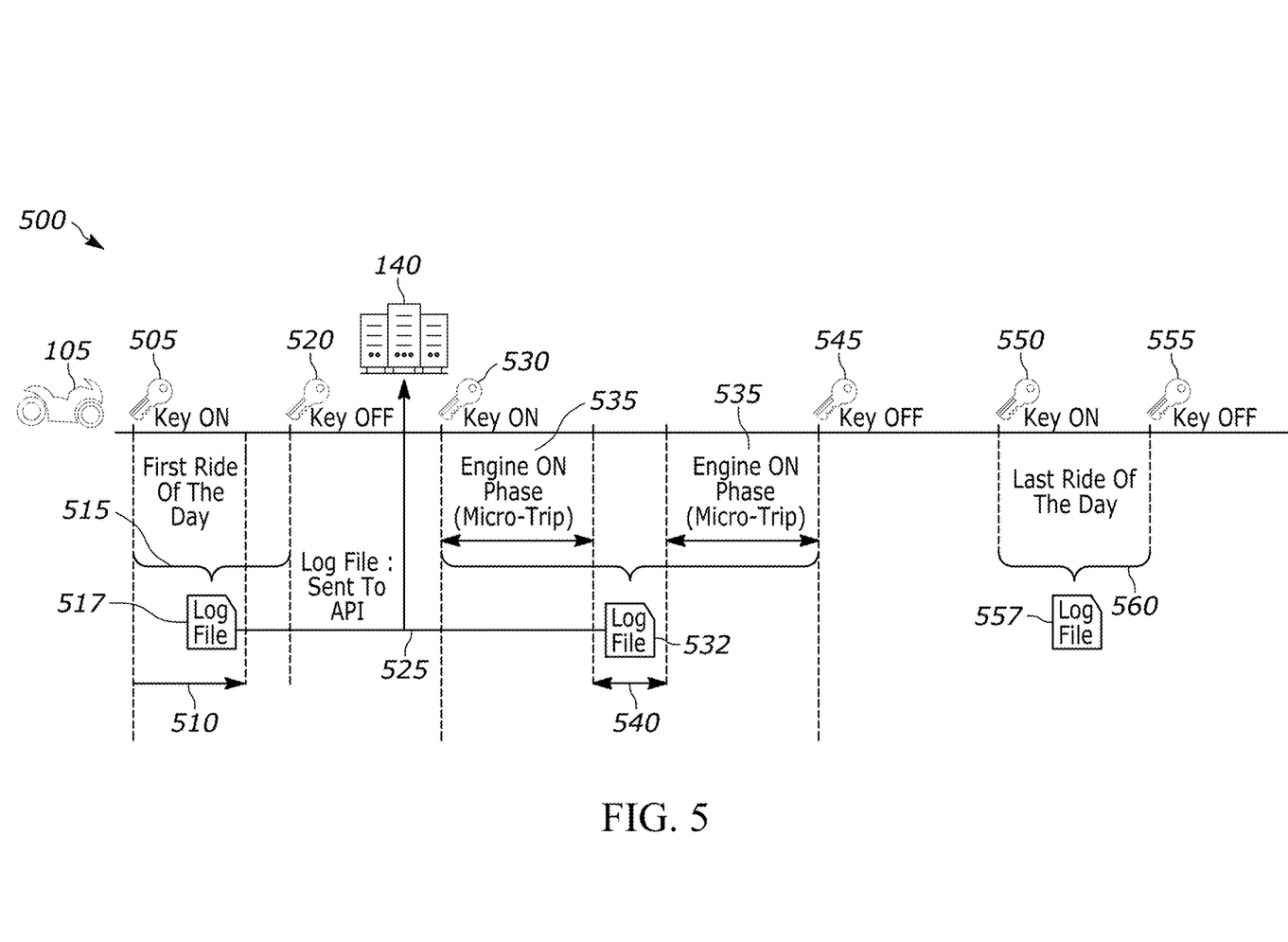
FIG. 5 is an illustration of a process of vehicle component health detection, according to some aspects.
Figure 6:
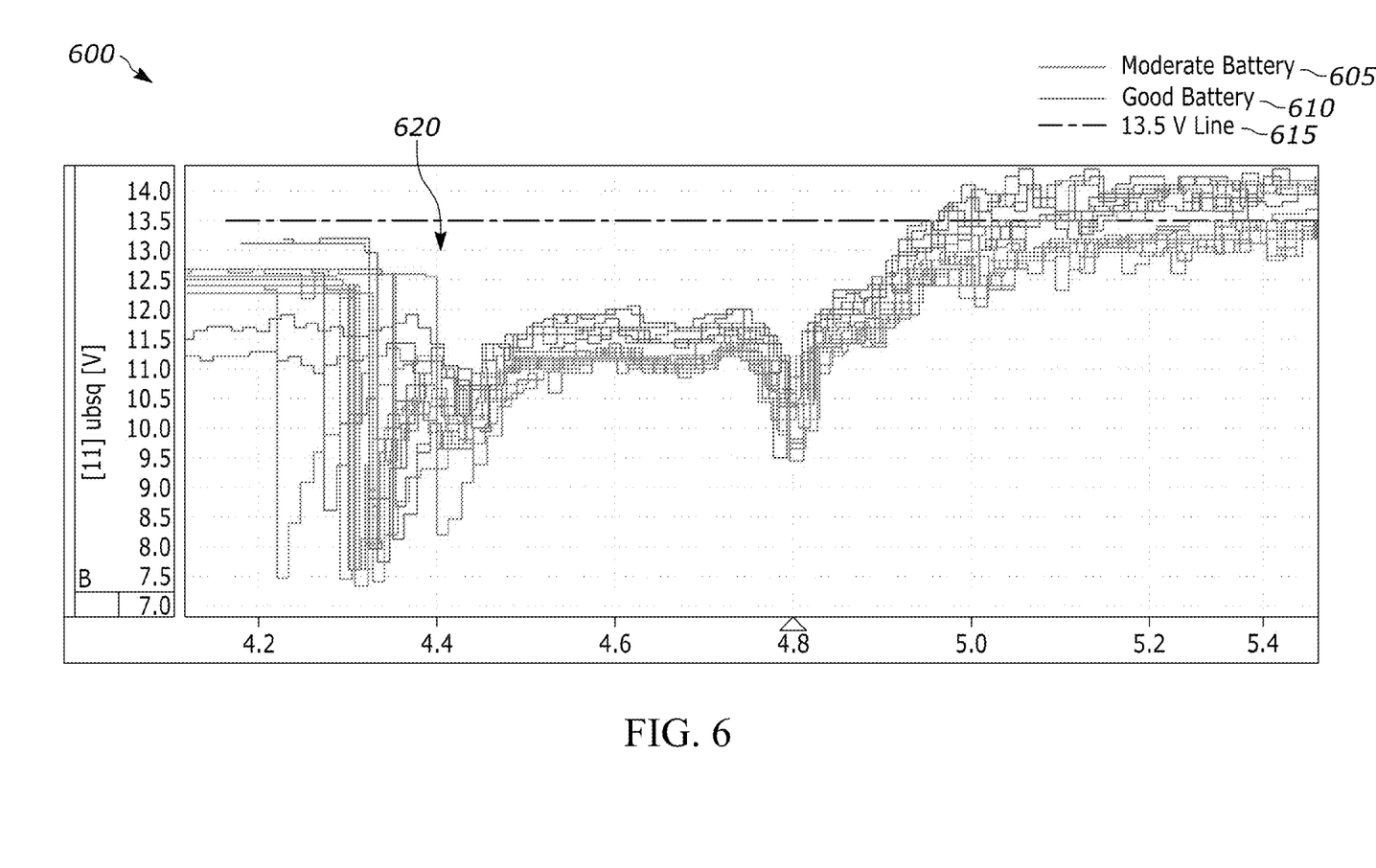
FIG. 6 is a graph of a vehicle battery start-up response, according to some aspects.

FIG. 5 is an illustration of an example process 500 of vehicle battery health detection, according to some aspects. The process 500 is performed, for example, by the second server 150, and includes monitoring the vehicle 105 ride and engine start up conditions. In some examples, the battery is monitored by sensor 102, or a similar sensor, configured to detect a voltage level of the battery. For instance, the battery is monitored during the start-up, or cranking, of the vehicle 105. In particular, the battery is monitored for a coup-de-fouet effect until engine speed crosses a specified threshold after cranking is initiated, as illustrated in FIG. 6. In some examples, the threshold occurs within the first 500 milliseconds of cranking. In some instances, the coup-de-fouet effect corresponds with the initial moments of electrical connection between the battery and a load. For example, during engine start up, the battery experiences a coup-de-fouet when the battery engages the engine starter and begins the cranking of the engine crankshaft. Additionally, process 500 includes monitoring and recording engine speed, or engine RPM, and engine temperature, as previously described. In some instances, process 500 monitors the coup-de-fouet and correlates the operational data 107 with the state-of-health of the battery. The process 500 incudes STEP 505, where the vehicle start-up is engaged. At STEP 510, when the vehicle start-up is engaged (e.g., the first ride of the day), a logging program running on the electronic processor 125 of the controller 110 begins logging the operational data 107 and saving the data in a first log file 517. The logging program includes a timer that is configured to increment only when both the engine RPM is greater than a predetermined RPM threshold and an engine throttle percentage is greater than a predetermined throttle percentage threshold. Once the timer exceeds a predetermined timer threshold and a battery voltage after engine shut off exceeds a battery threshold, monitoring of the next engine start-up, or engine crank, is enabled. The process 500 includes STEP 515, where a log file for the first ride of the day is generated. The first log file 517 includes the operational data 107 gathered during the first ride of the day. At STEP 520, the engine is shut-off by the rider, and the log file is completed. The log file is then sent to the first server 140 at STEP 525.

The process 500 also monitors additional or subsequent vehicle rides, such as when the vehicle 105 is turned on at STEP 530. A second log file 532 for subsequent vehicle rides is generated similar to the first log file 517 as previously described. During the subsequent vehicle rides, the engine may experience an engine-on phase 535 and an engine-off phase 540. When the engine monitoring is enabled, as previously described, and the engine-off time is greater than a predetermined threshold, the monitoring is disabled. The process 500 includes STEP 545, where the vehicle 105 is turned off and the subsequent vehicle ride is ended. The second log file 532 is then sent to the first server 140, as previously described. The process 500 includes a last ride of the day, where the vehicle is turned on at STEP 550 and turned off at STEP 555. A third log file 557 for the last ride of the day is generated, similarly to the previous log files, at STEP 560. The log files include operational data 107 used to generate a state-of-health for the motorcycle battery, as previously described. In some examples, the state-of-health is a total remaining battery life, or an approximate number of remaining engine cranks. In some instances, the state-of-health includes other information, such as an available current, total voltage, approximate power output, an estimated charge time, or the like.

FIG. 6 is a graph 600 of a vehicle battery start-up response, according to some aspects. The graph 600 includes a first trace 605 representative of a battery in moderate state-of-health condition. The graph 600 also includes a second trace 610 representative of a battery in a good state-of-health condition. The graph also illustrates a 13.5 Volt trace 615 as a reference for the first trace 605 and the second trace 610. The graph 600 illustrates the coup-de-fouet effect 620 that corresponds with engine start-up, as previously described.

Accordingly, various implementations of the systems and methods described herein provide, among other things, techniques for the detection of vehicle component health. Other features and advantages of the invention are set forth in the following claims.

In the foregoing specification, specific examples have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus.

An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way but may also be configured in ways that are not listed.

What is claimed is:

1. A system of diagnosing vehicle component health, the system comprising:
 a battery of a motorcycle;
 a sensor coupled to the battery, the sensor configured to obtain operational data including a measured coup-de-fouet effect and output a signal including the operational data;
 a vehicle electronic processor configured to:
  receive the signal from the sensor;
  generate a log file including the operational data and including a plurality of sequenced rows captured during an engine start-up event;
  increment a timer when an engine revolution-per-minute (RPM) exceeds a predetermined RPM threshold and an engine throttle percentage exceeds a predetermined throttle percentage threshold;
  detect an engine shut-off event;
  complete the log file in response to detecting the engine shut-off event;
 a communication device configured to wirelessly transmit the log file to an external electronic processor located on a server, the external electronic processor configured determine a state-of-health of the battery and transmit the state-of-health of the battery; and
 an external device configured to receive the state-of-health of the battery and display the state-of-health of the battery.

2. The system of claim 1, wherein the communication device is a dongle device configured to be installed in the motorcycle and to wirelessly communicate with the server via a cellular communication.

3. The system of claim 1, wherein the communication device is a vehicle motorcycle central control unit configured to wirelessly communicate with the server via a cellular communication.

4. The system of claim 1, wherein determining the state-of-health of the battery includes inputting the plurality of sequenced rows into a machine learning model, the machine learning model configured to:
 determine a classification score for each of the plurality of sequenced rows,
 determine an average classification score for the plurality of sequenced rows,
 determine the state-of-health for the battery based upon the average classification score and the measured coup-de-fouet effect.

5. A method of diagnosing a motorcycle air filter, the method comprising:
 obtaining operational data via a sensor electronically coupled to the motorcycle air filter,
 storing the operational data in a memory of the motorcycle,
 retrieving, via a motorcycle electronic processor, the operational data from the memory of the motorcycle, generating, via the motorcycle electronic processor, a log file comprising the operational data, the log file including a plurality of sequenced rows;

transmitting, via the motorcycle electronic processor, the log file to an external electronic processor, determining, via the external electronic processor, a plurality of classification model features using the operational data and the plurality of sequenced rows from the log file, collating, via the external electronic processor, the plurality of classification model features into a plurality of sequenced rows within the plurality of sequenced rows of the log file, inputting, into a machine learning model, the plurality of sequenced rows, determining, via the machine learning model, a classification score for each of the plurality of sequenced rows, determining an average classification score for the plurality of sequenced rows, determining a state-of-health for the motorcycle air filter based upon the average classification score, and in response to determining the state-of-health for the motorcycle air filter, transmitting to an external device, via the external electronic processor, the state-of-health for the motorcycle air filter.

6. The method of claim 5, wherein the plurality of classification model features includes one selected from a group consisting of an air filter flow factor, a vehicle speed, a vehicle throttle percentage, and a rate of change of air flow pressure.

7. The method of claim 5, wherein the plurality of classification model features includes a mathematical weight assigned to the motorcycle air filter.

8. The method of claim 5, the method further comprising:
obtaining second operational data corresponding to second operational parameter of a second vehicle component,
computing a second plurality of classification model features using the second operational data,
collating the second plurality of classification model features into the plurality of sequenced rows, and
inputting, into the machine learning model, the plurality of sequenced rows.

9. The method of claim 5, wherein the operational data includes at least one from a group consisting of an engine throttle percentage, an engine revolution per minute, an engine manifold pressure, and an intake air temperature.

10. A method of diagnosing a motorcycle battery, the method comprising:
obtaining motorcycle battery voltage data via a sensor electronically coupled to the motorcycle battery;
storing the battery voltage data in a memory of the motorcycle;
detecting, via an electronic processor, an engine start-up event of the motorcycle corresponding to an initiation of engine cranking, wherein the battery voltage data captures a coup-de-fouet effect of the motorcycle battery;
incrementing, via the electronic processor, a timer when an engine revolution-per-minute (RPM) exceeds a predetermined RPM threshold and an engine throttle percentage exceeds a predetermined throttle percentage threshold;

generating, via the electronic processor, a first log file including the battery voltage data recorded during a first ride, the first log file including a plurality of sequenced rows captured during the engine start-up event;

detecting, via the electronic processor, an engine shut-off event associated with the first ride;

completing the first log file in response to the detection of the engine shut-off event; transmitting the first log file, via a communication module, to an external server;

detecting, via the electronic processor, an engine start-up event during a second ride, the second ride occurring after the first ride;

generating, via the electronic processor, a second log file comprising the battery voltage data recorded during the second ride, the second log file including a plurality of sequenced rows captured during the engine start-up event;

detecting, via the electronic processor, an engine shut-off event associated with the second ride;

completing the second log file in response to detection of the engine shut-off event and transmitting the second log file via the communication module to the external server;

detecting, via the electronic processor, an engine start-up event during a third ride, the third ride occurring after the second ride;

generating, via the electronic processor, a third log file comprising the battery voltage data recorded during the third ride, the third log file including a plurality of sequenced rows captured during the engine start-up event;

detecting, via the electronic processor, an engine shut-off event associated with the third ride;

completing the third log file upon detection of the engine shut-off event and transmitting the third log file via the communication module to the external server; and processing, by a machine learning algorithm executed by the external server, the first, second, and third log files to determine a state-of-health for the motorcycle battery, and, in response to determining the state-of-health, transmitting the state-of-health to an external device.

11. The method of diagnosing a motorcycle battery according to claim 10, wherein the battery voltage data comprises a voltage drop occurring during the coup-de-fouet effect.

12. The method of diagnosing a motorcycle battery according to claim 10, further comprising:
logging, via the electronic processor, additional operational data including engine RPM and engine throttle percentage values into each of the first, second, and third log files.

13. The method of diagnosing a motorcycle battery according to claim 10, wherein the algorithm executed by the external server is a machine learning model.

14. The method of diagnosing a motorcycle battery according to claim 10, wherein the state-of-health is indicative of remaining battery life of the motorcycle battery.

15. The method of diagnosing a motorcycle battery according to claim 10, wherein transmitting the state-of-health comprises transmitting actionable advice for battery repair or replacement to the external device.

* * * * *